United States Patent [19]

Sung

[11] Patent Number: 5,547,893
[45] Date of Patent: Aug. 20, 1996

[54] METHOD FOR FABRICATING AN EMBEDDED VERTICAL BIPOLAR TRANSISTOR AND A MEMORY CELL

[75] Inventor: JanMye Sung, Yang-Mei, Taiwan

[73] Assignee: Vanguard International Semiconductor Corp., Hsin-Chu, Taiwan

[21] Appl. No.: 578,923

[22] Filed: Dec. 27, 1995

[51] Int. Cl.$^6$ ............................ H01L 21/70; H01L 27/00
[52] U.S. Cl. ...................... 437/52; 437/31; 437/56; 437/60; 437/919
[58] Field of Search ................... 437/52, 919, 31, 437/60, 56–57, 47–48; 257/306–310; 148/DIG. 14

[56] References Cited

U.S. PATENT DOCUMENTS

| | | | |
|---|---|---|---|
| 5,238,860 | 8/1993 | Sawada et al. | 437/52 |
| 5,336,632 | 8/1994 | Imamura | 437/60 |
| 5,389,566 | 2/1995 | Lage | 437/52 |
| 5,401,681 | 3/1995 | Dennison | 437/60 |
| 5,422,295 | 6/1995 | Choi et al. | 437/52 |
| 5,496,758 | 3/1996 | Ema | 437/52 |

*Primary Examiner*—H. Jey Tsai
*Attorney, Agent, or Firm*—George O. Saile; William J. Stoffel

[57] ABSTRACT

The present invention provides a method of simultaneously forming CMOS DRAM cells, CMOS devices, and vertical bipolar transistors on the same chip. The invention utilities a CMOS DRAM process to simultaneously fabricate a vertical bipolar transistor and uses only one additional mask (a base implant mask) compared to forming the DRAM cell alone. Also, to reduce the bipolar collector plug resistance, the process uses a tungsten-plug module where the collector is formed within a field oxide region near the base.

30 Claims, 11 Drawing Sheets

5,547,893

METHOD FOR FABRICATING AN EMBEDDED VERTICAL BIPOLAR TRANSISTOR AND A MEMORY CELL

BACKGROUND OF INVENTION

1) Field of the Invention

This invention relates generally to fabrication of memory cells and more particularly to a method for simultaneously fabricating vertical bipolar transistors, CMOS transistors and a CMOS dynamic random access memory (DRAM) cell.

2) Description of the Prior Art

There is a need to build complementary metal oxide semiconductor (CMOS) transistors, memory cells, and bipolar transistors on the same semiconductor chip. CMOS and bipolar transistors have different electrical properties and for certain applications a combination of both CMOS and bipolar devices are required. It is known that bipolar devices have a lower variation of threshold voltage (Vth), a high driving capability and better mismatch characteristics than CMOS devices. Bipolar devices can improve the sensing amplifier speed and driving power which are critical in high speed integrated circuits.

However, to integration of CMOS and bipolar devices typically requires a buried layer and a post-epitaxy processes. These extra process add significant costs and the post-epitaxy process reduce the product yields. It is desirable to used a combination of Bipolar and CMOS devices in semiconductor chips, but the increased manufacturing costs and reduced yields make wide spread implementation impracticable.

Semiconductor technologies have dramatically increased the circuit density on a chip. The miniaturized devices built in and on semiconductor substrate are very closely spaced and their packing density has increased significantly. More recent advances in photolithographic techniques, such as phase-shifting masks, and self-aligning process steps have further reduced the device sized and increased circuit density. This has lead to ultra large scale integration (ULSI) with minimum device dimensions less than a micrometer and more than a million transistors on a chip. With this improved integration, some circuit elements experience electrical limitation due to their down sizing.

One such circuit element experiencing electrical limitations is the array of storage cells on a dynamic random access memory (DRAM) chip. These individual DRAM storage cells, usually consisting of a single metal-oxide-semiconductor field effect transistor (MOS-FET) and a single capacitor are used extensively in the electronic industry for storing data. A single DRAM cell stores a bit of data on the capacitor as electrical charge. The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of the memory cell as well as consumes excessive power during low-voltage operation by impeding device operation.

Many of the prior art methods require substantially more processing steps or/and planar structures which make the manufacturing process more complex and costly. For example, most process use an epitaxy layer and require additional steps and costs. Therefore, it is very desirable to develop processes that are as simple as possible and also provide methods for fabrication CMOS and Bipolar transistors in the same process.

There is a challenge to develop methods of manufacturing simultaneously both bipolar and CMOS devices on the same chip. The process should minimize the manufacturing costs and maximize the device yields. The process should not require an epitaxy layer. In particular, there is a challenge to develop a method for fabricating simultaneously CMOS transistors, CMOS memory cells and Bipolar devices which minimizes the number of photoresist masking operations and hot process steps. Also the process should provide maximum process tolerance to maximize product yields. There is also a need to minimize the resistance between the base and collector in the bipolar transistor.

SUMMARY OF THE INVENTION

It is an object of the present invention to provide a method for simultaneously fabricating memory cells, CMOS devices, and bipolar devices on a semiconductor substrate.

It is an object of the present invention to provide a method for simultaneously fabricating DRAM CMOS memory cells, CMOS transistors, and bipolar transistors using a minimum additional number of process steps and process complexity.

It is an object of the present invention to provide a method for fabricating a CMOS DRAM and a vertical bipolar transistor with a low collector resistance.

It is another object of the present invention to provide a method for simultaneously fabricating memory cells, CMOS transistors, and bipolar transistors having a low resistance collector and a n+ polysilicon emitter without using an epitaxy layer.

To accomplish the above objectives, the present invention provides a method of simultaneously forming CMOS DRAM cells, CMOS devices (e.g., transistors), and vertical bipolar transistors on the same chip. The invention utilities a CMOS DRAM process to simultaneously fabricate vertical bipolar transistors and uses only one additional mask (a base implant mask) compared to forming the DRAM cell alone. Also, to reduce the collector plug resistance, the process uses an ingenious DRAM storage contact node opening, a storage node poly definition, and a DRAM backend tungsten plug process. Unlike other bipolar processes where the extrinsic collector contact is on active silicon, this invention forms the collector contact through a field oxide area which reduce the distance between the collector and base, thereby reducing the collector resistance. The invention's scheme can shorten the distance between extrinsic collector and the intrinsic collector, thus further reducing collector resistance.

In slightly more detail, the present invention provides a method of simultaneously fabricating a memory cell and a vertical bipolar transistor; in a substrate having spaced field oxide regions defining a DRAM active area and a bipolar active area; two spaced gate electrodes over said DRAM active area; a well of a first type conductivity in said DRAM active area and a well of a second opposite type conductivity in said bipolar active area; comprising the sequential process steps of: forming a base region in the bipolar active region;

forming a first dielectric layer over the substrate surface; forming storage node contact openings in the first dielectric layer between the field oxide regions and the gate electrodes in the DRAM active area; and in the bipolar active area, forming an emitter opening through the first dielectric layer over portions of the base region; and a collector opening through the first dielectric layer and through the field oxide region; forming a first doped polysilicon layer over the oxide layer; patterning the first doped polysilicon layer forming storage electrodes over the storage node contact openings and an emitter contact plug in the emitter opening; and forming, during the patterning the doped polysilicon layer, a collector trench in the DRAM active area through the collector opening; the collector trench having side walls; the storage electrodes and the emitter contact plug containing impurities; forming a capacitor dielectric layer over the storage electrodes; and a collector trench spacer on the sidewalls of the collector trench; depositing a top electrode over the capacitor dielectric layer; heating the substrate forming an emitter region under the emitter contact plug, and forming source regions under the storage electrodes by diffusing the impurities from the emitter contact plug and the storage electrodes; forming a base contact opening through the first dielectric layer over portions of the base region and a bit line opening through the first dielectric layer between the spaced electrodes; forming bit line spacers over at least portions of the sidewalls of the top storage nodes over the gate electrodes and over portions of the sidewalls of the gate electrode; and forming base contact spacers on the sidewalls of the emitter contact plug and the storage electrode; forming an oxide layer over the substrate surface; removing the oxide layer over the bit line opening; forming a second doped polysilicon layer over the resultant surface; the second doped polysilicon layer tilling the bit line opening and contacting the substrate; patterning the oxide layer and the second doped polysilicon layer forming a bit line contact plug in the bit line opening contacting the substrate surface; The bit line contact plug having an impurity doping which diffuses into the substrate thereby forming a bit line; implanting ions through the collector trench forming a collector region at the bottom of the collector trench; and implanting ions through the base contact opening forming an extrinsic base in the base region thereby forming the memory cell and the vertical bipolar transistor.

DETAILED DESCRIPTION OF THE PREFERRED EMBODIMENTS

The present invention will be described in detail with reference to the accompanying drawings. It should be noted that the drawings are in greatly simplified form. In practice, the semiconductor substrate will have many device structures formed within and thereon and the devices can be connected with suitable metallurgy in various electronic electric circuit configurations.

The present invention provides a method of simultaneously forming CMOS DRAM cells, vertical bipolar transistors, and CMOS transistors. First, the processes for forming the field oxide (FOX) and the gate electrode structure as presently practiced in manufacturing DRAM cells are only briefly described in order to better understand the current invention. Second, the novel method to simultaneously fabricate the memory cells, CMOS transistors, and bipolar transistors will be described in detail. The term "substrate"0 is meant to include other devices, not shown, both in and on the substrate. Also, the term "substrate surface" is meant to include devices and layer formed within and over the substrate and is meant to include the uppermost surfaces of the structures formed on the substrate. The term "resultant surface" means the uppermost surfaces of the structures formed on the substrate.

Figure 1:
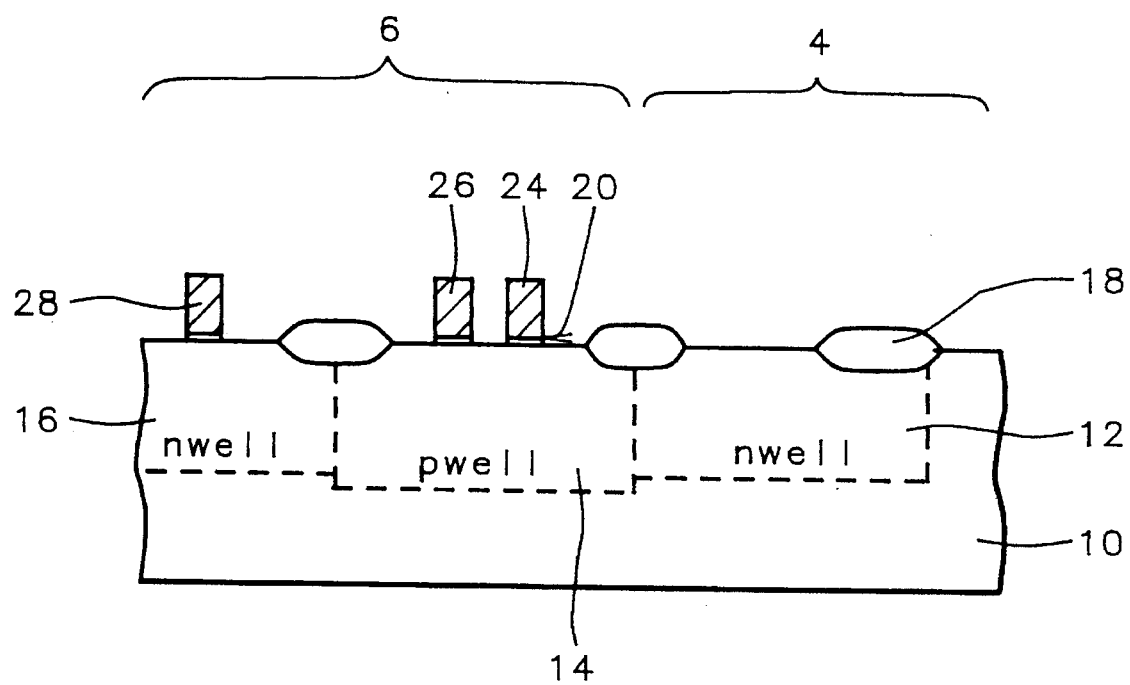
FIGS. 1 through 5, 6a–6d and 7–8 are cross sectional views for illustrating the method for simultaneously manufacturing a CMOS DRAM cell, a CMOS transistor, and a bipolar transistor according to the present invention.

In a conventional semiconductor substrate 10, a well of a first type conductivity 14 is formed in the DRAM active area (e.g., NMOS area) and wells of a second opposite type conductivity 12 16 are formed in the bipolar active area 4 12 and PMOS area 16. The preferred substrate is preferably composed of a P-type single crystal silicon having a (100) crystallographic orientation. As shown in FIG. 1, for purposes of this illustration, the bipolar active region 4, the active region where a bipolar transistor will be formed, is shown as a N-well. It is understood by those skilled in the art that the conductivity types can be switched to form a P-well in the bipolar active region. Likewise, a DRAM active region 6 is shown with a P-well 14 in the area where a DRAM cell (NMOS transistor and capacitors) will be fabricated and a N-well 16 is in the area where a PMOS transistor will be fabricated. The wells can be formed by conventional photo masking and ion implantation techniques. The n and p type wells can be formed before or after the field oxide regions.

The n-well 12 in the DRAM active area preferably has a n-type impurity. Preferably the concentration profile is non-uniform with a concentration in the range of between about 1E15 and 1E17 atoms/cm$^3$.

As shown in FIG. 1, field oxide regions 18 are formed on the semiconductor substrate 10 for defining active regions and isolation regions. A relatively thick field oxide (FOX) 18 is formed around the active device areas to electrically isolate these areas. This field oxide is formed by masking the active device areas with a thick silicon oxide (pad oxide) and a thicker silicon nitride layer which forms an oxidation barrier. The silicon substrate is then oxidized in an oxidizing ambient to form the field oxide. The preferred thickness being in the range of about 4000 to 7000 Å. The silicon nitride barrier layer and the pad oxide are then removed with a conventional wet etch.

After the field oxide formation, p-well are preferably formed using conventional photo masking, ion implant, resist strip and drive-in processes. The p-well in the DRAM active area preferably has a p-type impurity concentration profile in the range of between about 1E15 and 1E17 atoms/cm$^3$.

Next, an optional threshold voltage layer (not shown in the figs) can be formed. Impurity ions having a p type conductivity are implanted into the substrate forming a threshold voltage implant layer. The threshold voltage implant layer has an impurity concentration preferably in the range of between about 1E12 and 1E13 atoms/cm$^3$ and a maximum depth in the range of between about 0.05 and 0.15 μm.

The semiconductor FET and bipolar devices are then formed in the active device areas. The most commonly used device for dynamic random access memory (DRAM) is MOSFET. This device is formed by first thermally oxidizing the active device area to form a thin gate oxide 20. The preferred thickness being from about 60 to 150 Å.

An appropriately doped polysilicon layer is deposited on substrate 10 and conventional photolithographic—etch techniques are used to pattern the gate oxide 20, and polysilicon layer, which comprise the gate electrodes. As shown in FIG. 1, for example, two gate electrodes are formed on the substrate surface in the DRAM active area. The electrodes comprise a gate oxide layer 20, a polysilicon gate 24 26 28. The spacing between the spaced electrodes 24 26 is preferably in the range of between about 0.3 and 1.0 μm. The spacing between the electrodes and the field oxide regions 18 is preferably in the range of between about 0.3 and 1.0 μm. Other variations of the FET memory cell configuration are possible as obvious to those skilled in the area. For example, gate electrodes can be formed over field oxide regions and function as word lines.

The remainder of this embodiment relates more specifically to those objects of the invention, which relate to the coincident formation of the CMOS DRAM cells, CMOS transistors, and bipolar transistors.

Figure 2:
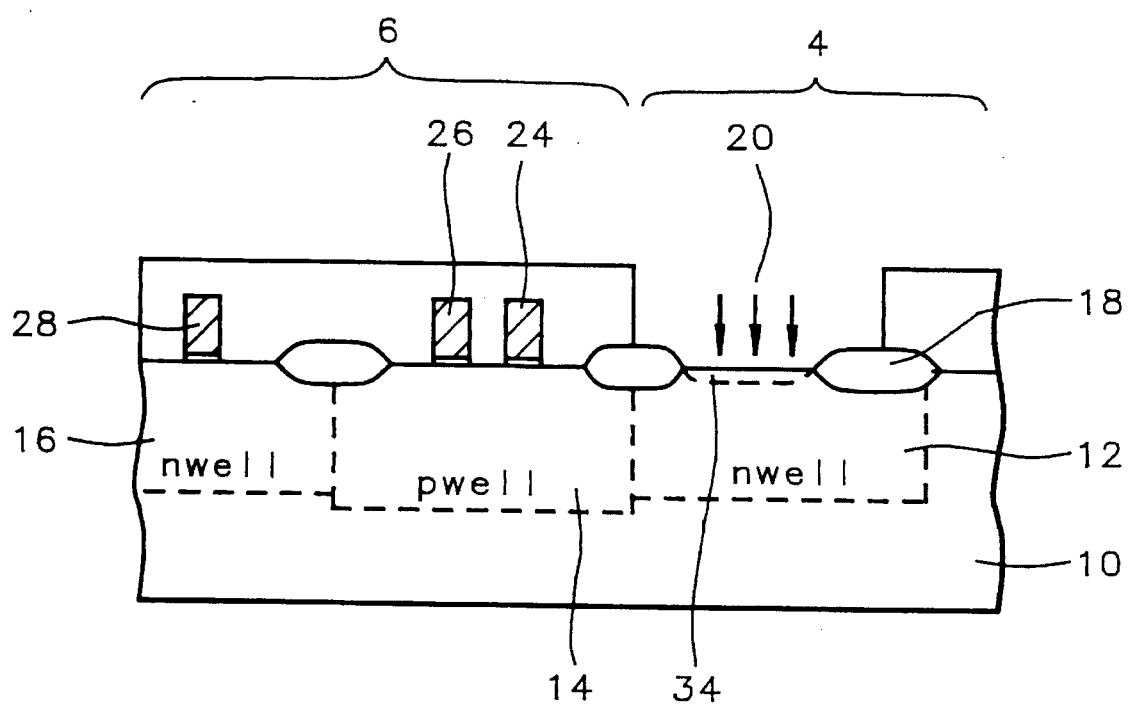

As shown in FIG. 2, impurity ions are implanted into the bipolar active area 4 to form a base region 34. The base region 34 is formed by implanting p-type impurity ions with an energy preferably in the range of between about 5 and 25 Kev and a dose in the range of between about 1E13 and 1E14 atoms/cm$^2$. The impurity ions preferably are boron or BF$_2$ and the base region preferably has an impurity concentration in the range of between about 1E17 and 1E18 atoms/cm$^3$. The base region diffuses deeper into the substrate with subsequent heat processes. When the processing is complete, the base 34 has a depth in the range of 0.2 to 0.4 μm.

Figure 3:
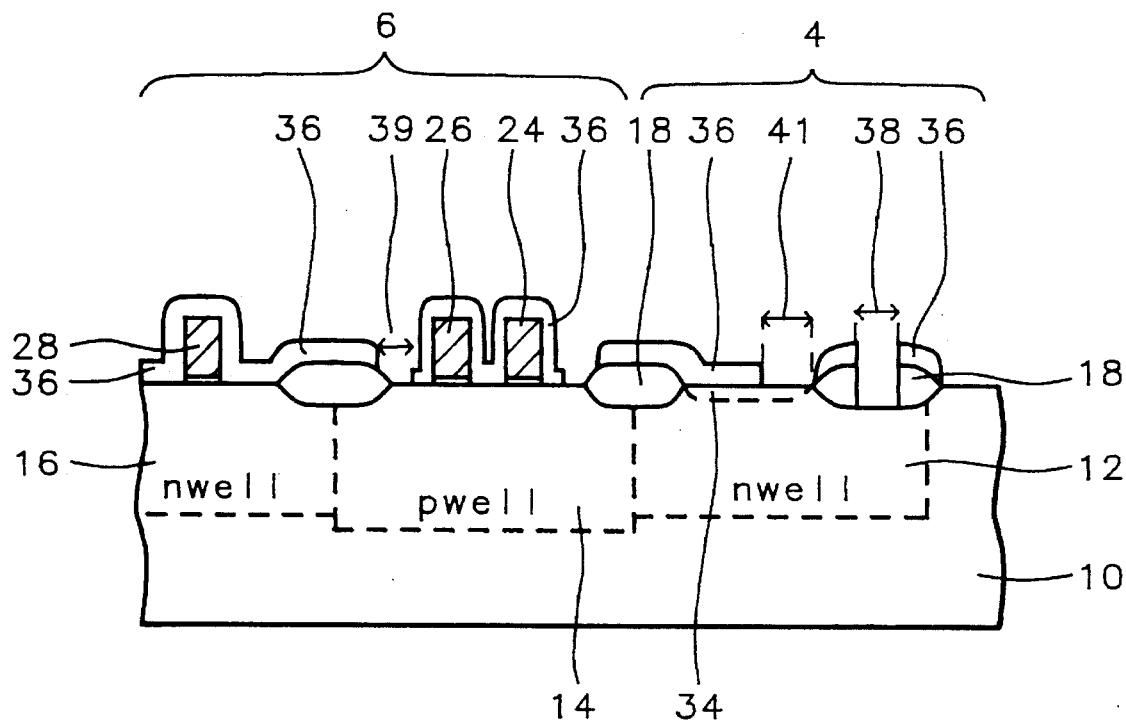

As shown in FIG. 3, a first dielectric layer 36 is formed over the substrate surface. The first dielectric layer 36 preferably has a thickness in the range of between about 1000 and 3000 Å and preferably is formed of oxide or nitfide. A first dielectric layer 36 formed of silicon oxide could made by a chemical vapor deposition using tetraethoxysilane (TEOS) at a temperature in the range of about 650° to 900° C.

Subsequently storage node contact openings 39, an emitter opening 41 and a collector opening 38 are formed using conventional photo and etch processes as shown in FIG. 3. Storage node contact openings 39 are formed in the first dielectric layer 36 between the field oxide regions 18 and the gate electrodes 20 in the DRAM active area 6. Also, in the bipolar active area 4, an emitter opening 41 is formed over portions of the base region 34. A collector opening 38 is formed through the first dielectric layer 36 and through the field oxide region 18 in the bipolar regions 4. The openings can be formed by using conventional photo masking, oxide etching and photo strip processes.

Figure 4:
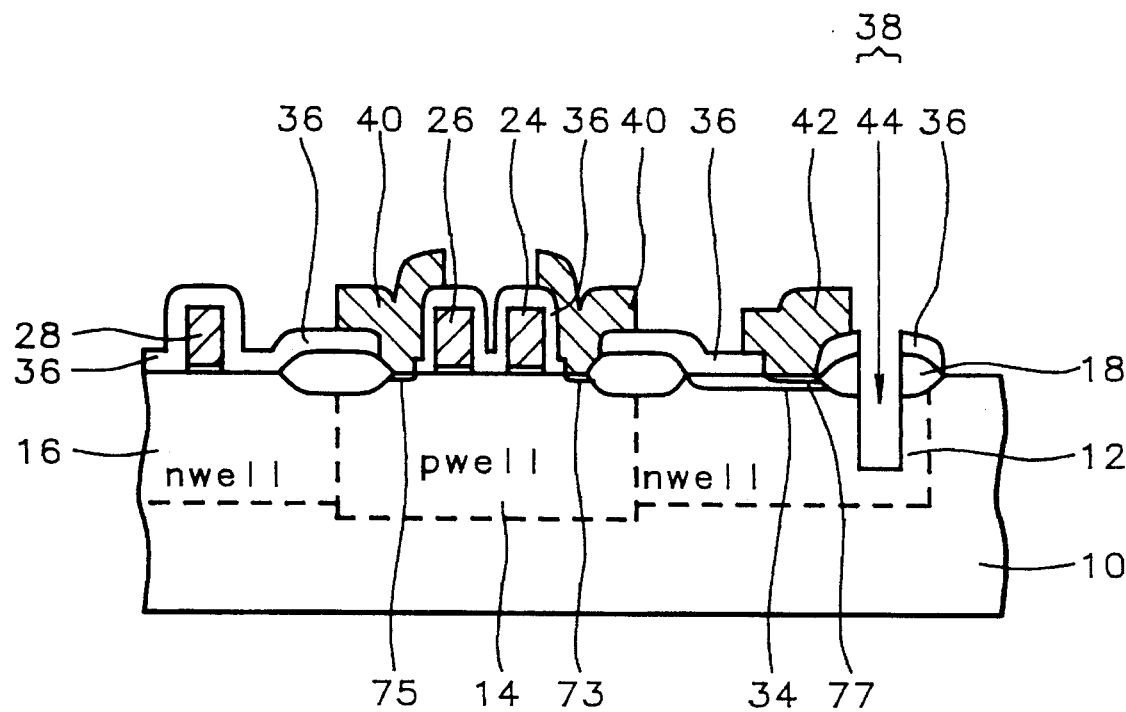

A doped polysilicon layer is then formed over the resultant surface. Using conventional photo and etching techniques, storage electrodes 40 and an emitter contact plugs 42 are formed. As shown in FIG. 4, the storage electrodes 40 are formed over the storage contact openings 39 and the emitter contact plug 42 is formed in the emitter opening 41. In addition, during the patterning step (e.g., etching step) of the doped polysilicon layer, a collector trench 44 is etched in the DRAM active area through the collector opening 38. The patterning of the doped polysilicon layer and the substrate can be performed by an etch using Cl$_2$, HBr and He. The collector trench 44 preferably has a depth in the range of between about 0.4 and 0.8 μm and an area in the range of between about 0.25 and 0.5 μm$^2$. The doped polysilicon layer which forms the storage electrodes 40 and the emitter contact plug 42, preferably has a thickness in the in the range of between about 2000 and 6000 Å and an impurity doping preferably in the range of between about 1E20 and 1E21 atoms/cm$^3$. The thickness of the storage electrode is determined by the storage capacity requirements.

During subsequent heating steps the impurities from the doped storage electrode 40 diffuse into the substrate forming drain regions 72 73. Also, the doped emitter contacts 42 will diffuse impurities to form the emitter region 77 in the substrate for the bipolar transistor. A separate heating step can be used to drive in the impurities. A conventional drive in heating/annealing step can be used to form the source/drain region 73 75 and the emitter region 77.

The source and drain regions 73, 75 preferably have a doping concentration in the range of between about 1E17 and 1E21 atoms/cm$^3$. The emitter region 77 preferably has an impurity concentration in the range of between about 1E18 and 1E21 atoms/cm$^3$.

Figure 5:
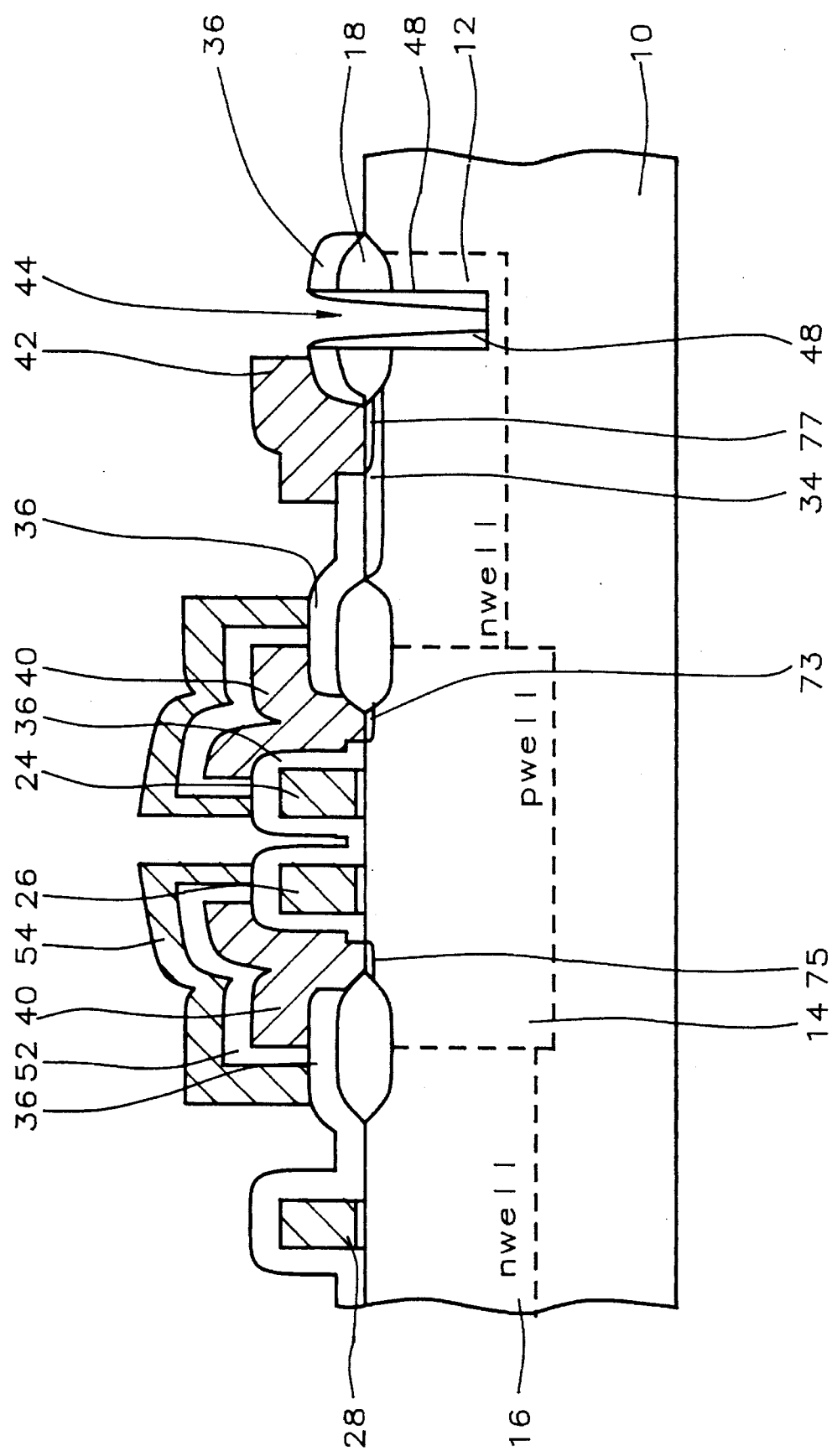

Next, a dielectric layer (not shown) is formed over the substrate surface and patterned to form capacitor dielectric layers 52 and collector trench spacers 48. As shown in FIG. 5, capacitor dielectric layer 52 is formed over the storage electrodes 40; and collector trench spacers 48 are formed on the sidewalls of the collector trench 44. The capacitor dielectric layer 52 and the collector trench spacers 48 are preferably formed of a material selected from the group consisting of: ONO (i.e., oxide, nitride, oxide), silicon nitride and silicon oxide and preferably have a thickness in the range of between about 50 and 90 Å.

Still referring to FIG. 5, a top electrode 54 is formed over the capacitor dielectric layer 52. The top electrode 54 is preferably formed from a n-doped polysilicon layer which is patterned using conventional photo and etching techniques. The top electrode 54 preferably has a thickness in the range between about 2000 and 4000 Å and a dopant concentration in the range of between about 1E20 and 1E21 atoms/cm$^3$.

Figure 6A:
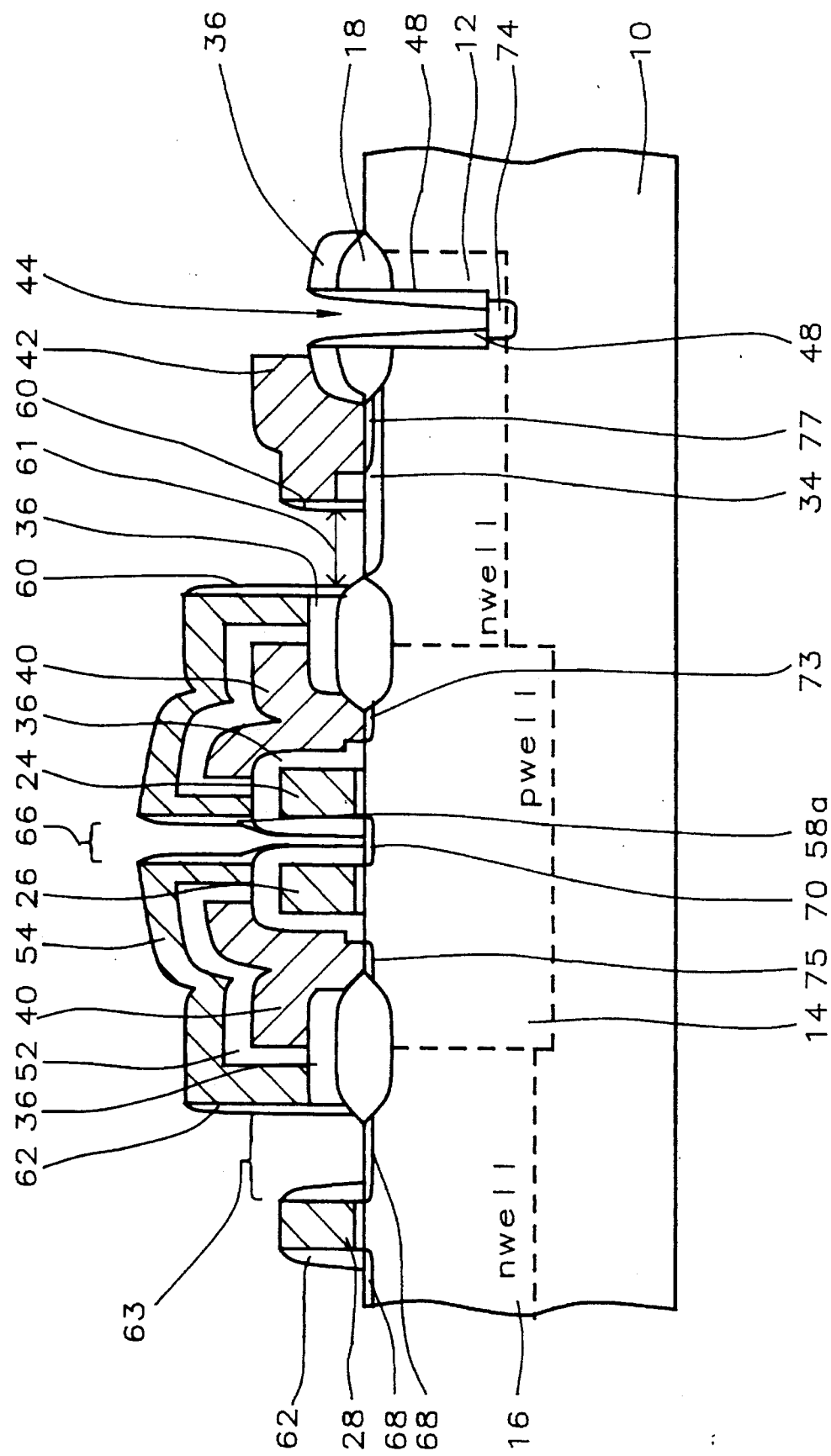

Turning to FIG. 6A, base contact opening 61, CMOS device source/drain openings 63 and bit line opening 66 are formed through said first dielectric layer 36 using conventional lithographic—etch techniques. The base contact opening 61 is formed over portions of said base region 34 and a bit line opening 66 is formed between said spaced electrodes 24.

Next, base contact spacers 60, bit line spacers 58A, and CMOS device gate spacers 62 are formed by forming a dielectric layer and anisotropically etching back the layer. See FIG. 6A. The base contact spacers 60 are formed on the sidewalls of the emitter contact plug 42 and the storage electrode 54 facing the base region 34. The gate spacers 62 are formed on the sidewalls of the gate. The gate spacers 62 and base contact spacers 60 preferably have a thickness in the range of between about 1000 and 3000 and more preferably about 2000 Å. The spacers 58A and 60 preferably are formed of silicon oxide. The spacers are preferably formed of silicon oxide formed by a conventional chemical vapor deposition using Tetraethylorthosilicate (TEOS).

Next, an optional lightly doped bit line 70 is formed by an photo and implant process. A bit line implant mask (e.g., NLLD mask) is formed over the substrate surface having openings over the bit lines openings 66. Impurity ions are implanted through the openings preferably at a large angle forming lightly doped bit lines 70 in the bit line contact opening 66. See FIG. 6A. The lightly doped bit lines 70 are now implanted between the spacers 58 preferably using a N type atomic species, for example, arsenic (As75). The implantation is usually done through a thin layer of silicon oxide of about 200 to 300 Å in thickness to minimize implant channeling and to protect against contamination by metals and other impurities. The large angle ion implant is preferably performed at an angle from vertical in the range of between about 30° and 60° and with a dose in the range of between about 1E13 and 1E14 atoms/sq-cm and with an energy in the range of between about 60 and 120 keV. After the implant the resist layer is removed. The lightly doped bit line 70 has a concentration profile preferably in the range of between about 1E17 and 1E18 atoms/cm$^3$.

Next, the P-type lightly doped drains (LLD) 68 of the CMOS transistor are formed using a large angle implant. A lightly doped drain implant mask (e.g., P-LLD mask) is formed over the substrate surface having openings over the CMOS LLD region 68. P-type impurity ions are implanted through the openings at a large angle forming lightly doped drain 68. The implant preferably uses a p type atomic species, for example, Boron. The implantation is usually done through a thin layer of silicon oxide of about 200 to 300 Å in thickness to minimize implant channeling and to protect against contamination by metals and other impurities. A typical implantation dose being between 1E13 to 1E14 atoms/cm$^2$ and an energy of between about 25 to 50 Kev. After the implant the resist layer is removed. The lightly doped drains 68 preferably have a concentration profile in the range of between about 1E17 and 1E18 atoms/cm$^3$.

Figure 6B:
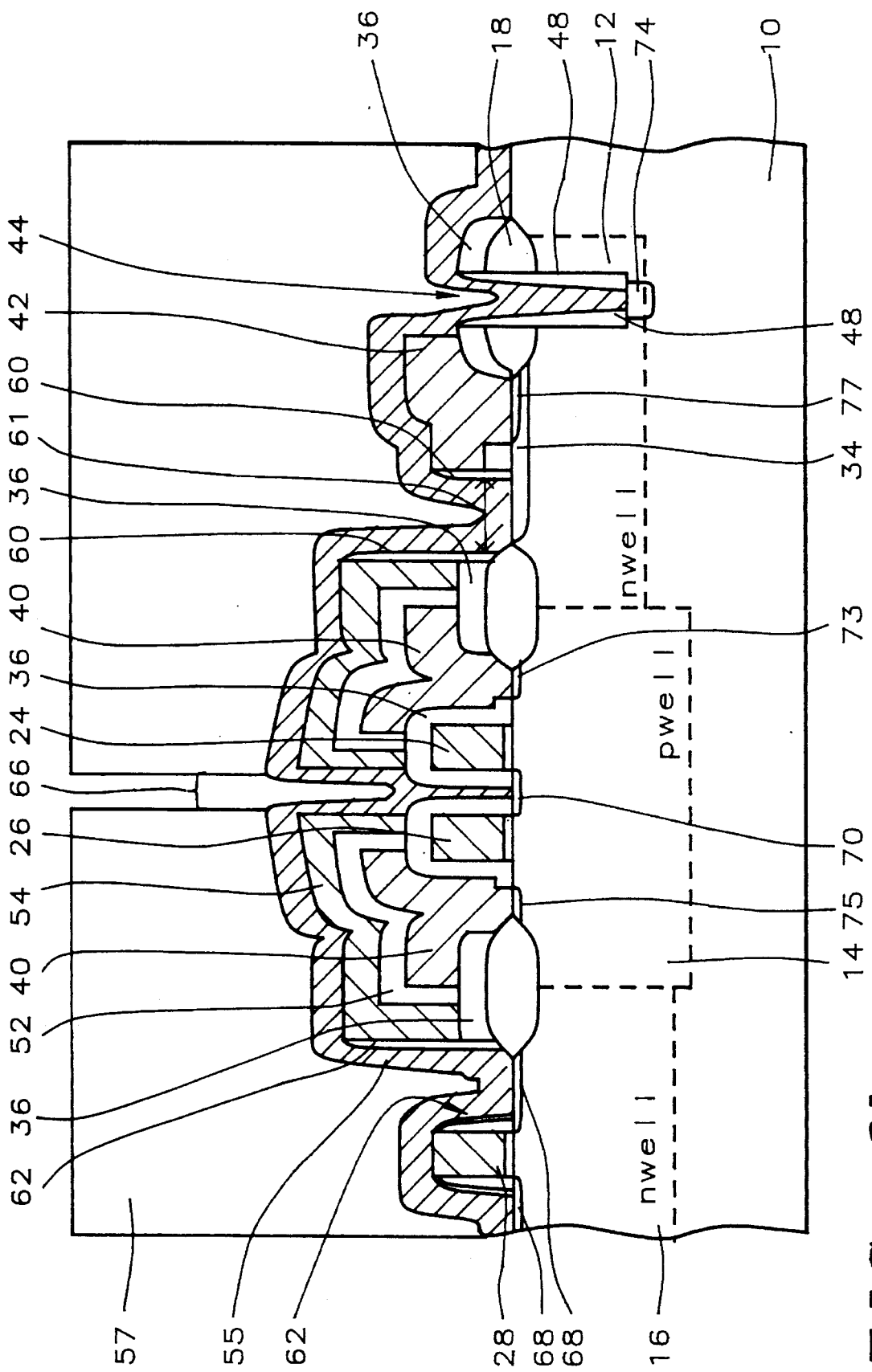

Turing to FIG. 6B, dielectric layer 55 is formed over the substrate surface. The dielectric layer is preferably formed of silicon oxide.

As shown in FIG. 6B, a bit line contact photo resist mask 57 is formed over the substrate surface. The exposed oxide layer 55 in the bit line opening 66 is etched away to expose the bit line 70 in the substrate.

Figure 6C:
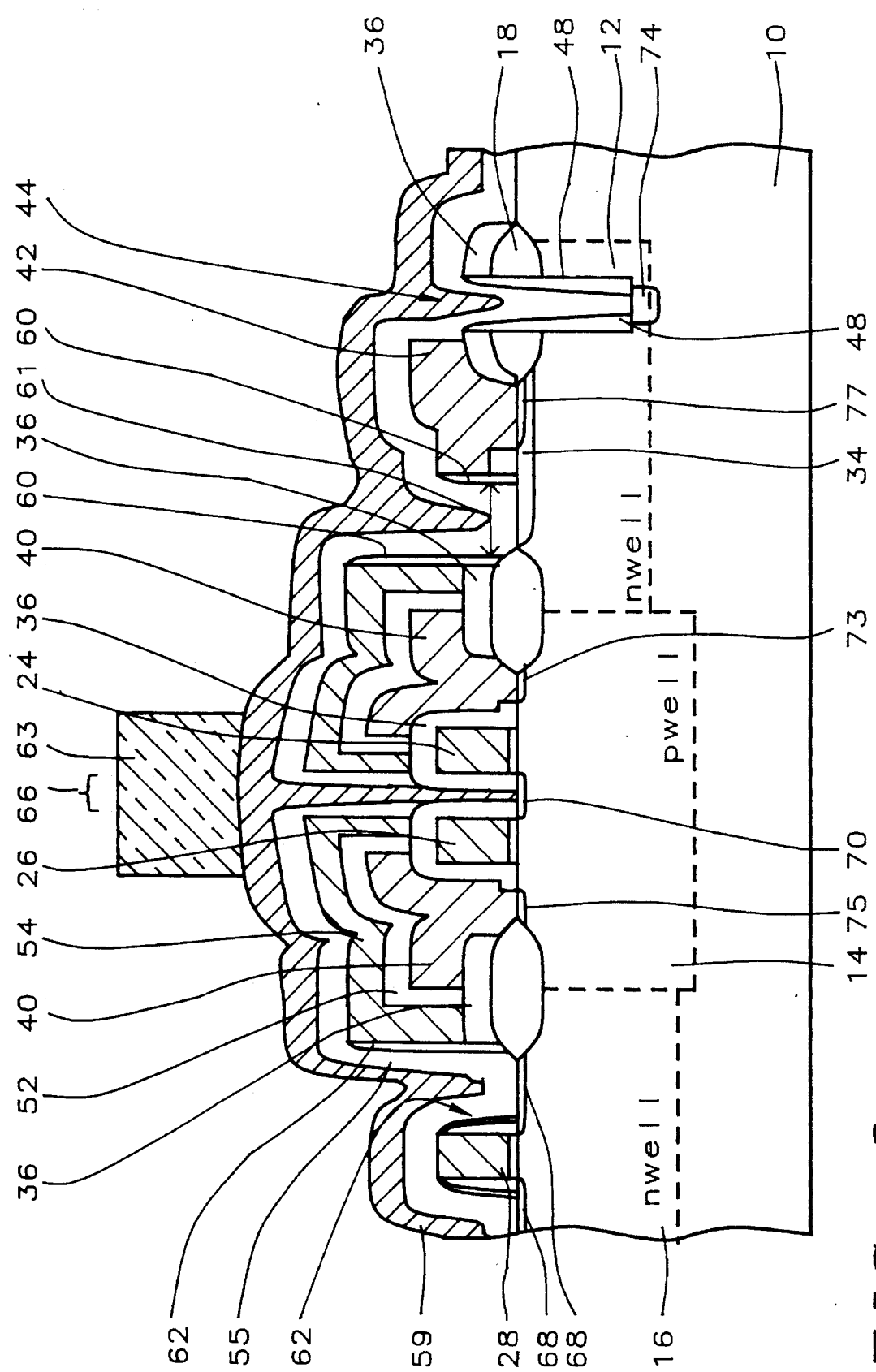

Referring to FIG. 6C, a doped polysilicon layer 59 is formed over the substrate surface and fills the bit line contact hole 66 forming an electrical contact to the bit line 70 72. The polysilicon layer 59 can be doped and can be formed of a polycide. The polysilicon layer 59 preferably doped with an n-type impurity with a concentration in the range of between about 1E20 and 1E21 atoms/cm$^3$.

The impurity from the bit line contact layer 59 diffuses into the substrate to form the a highly doped bit line region 72. The highly doped bit line region 72 preferably has a n-type impurity profile in the range of between about 1E18 and 1E20 atoms/cm$^3$. The diffusing occurs during subsequent heating steps.

Figure 6D:
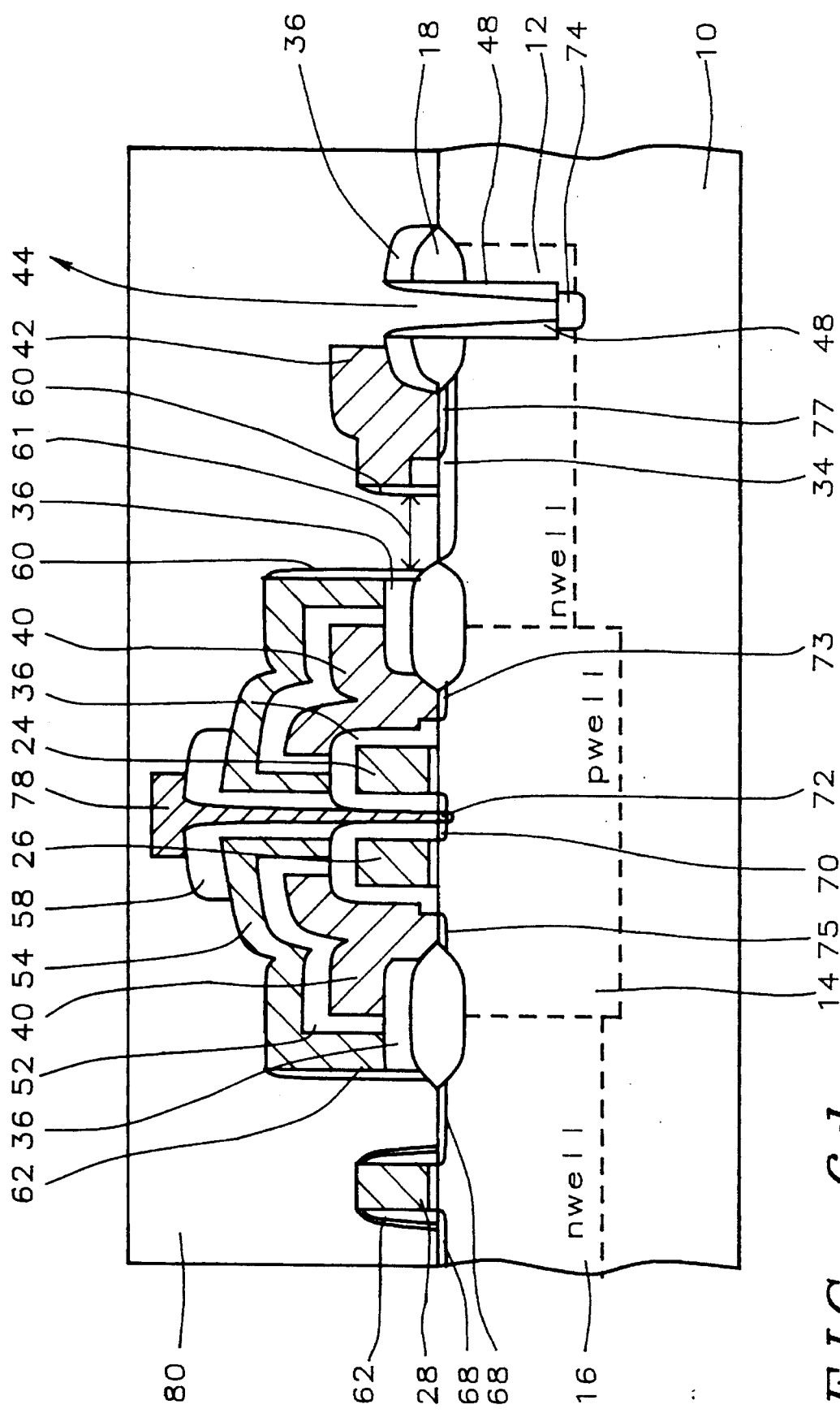

Next, a bit plug photoresist mask 63 is formed over the substrate surface as shown in FIG. 6C. The polysilicon layer 59 and the oxide layer 55 are then etched away using conventional etches as shown in FIG. 6D forming the bit line plug 78 contacting the bit line 70 72. The remaining oxide (bit line oxide 58) is left over at least portions of the top storage node 54 over the gate electrodes and over portions of the gate electrode as shown in FIG. 6D.

As shown in FIG. 6D, the highly doped collector region 74 is formed next. A collector Ion Implant (I/I) mask 80 having an opening over the collector trenches 44 is formed over the substrate surface. The same mask preferably has opening to implant N+ source/drain regions on other devices. Preferably N-type impurity ions are through the opening and collector trench 44 forming a highly doped collector region 74 at the bottom of the collector trench 44. The collector implantation preferably implants arsenic ions with a dose in the range of between about 1E15 and 1E16 atoms/sq-cm; and at an energy in the range of between about 50 and 100 Kev. The highly doped collector region 74 preferably has an impurity concentration profile in the range of between about 1E18 and 1E20 atoms/cm$^3$. After the implant, the resist layer 80 is removed.

Figure 7:
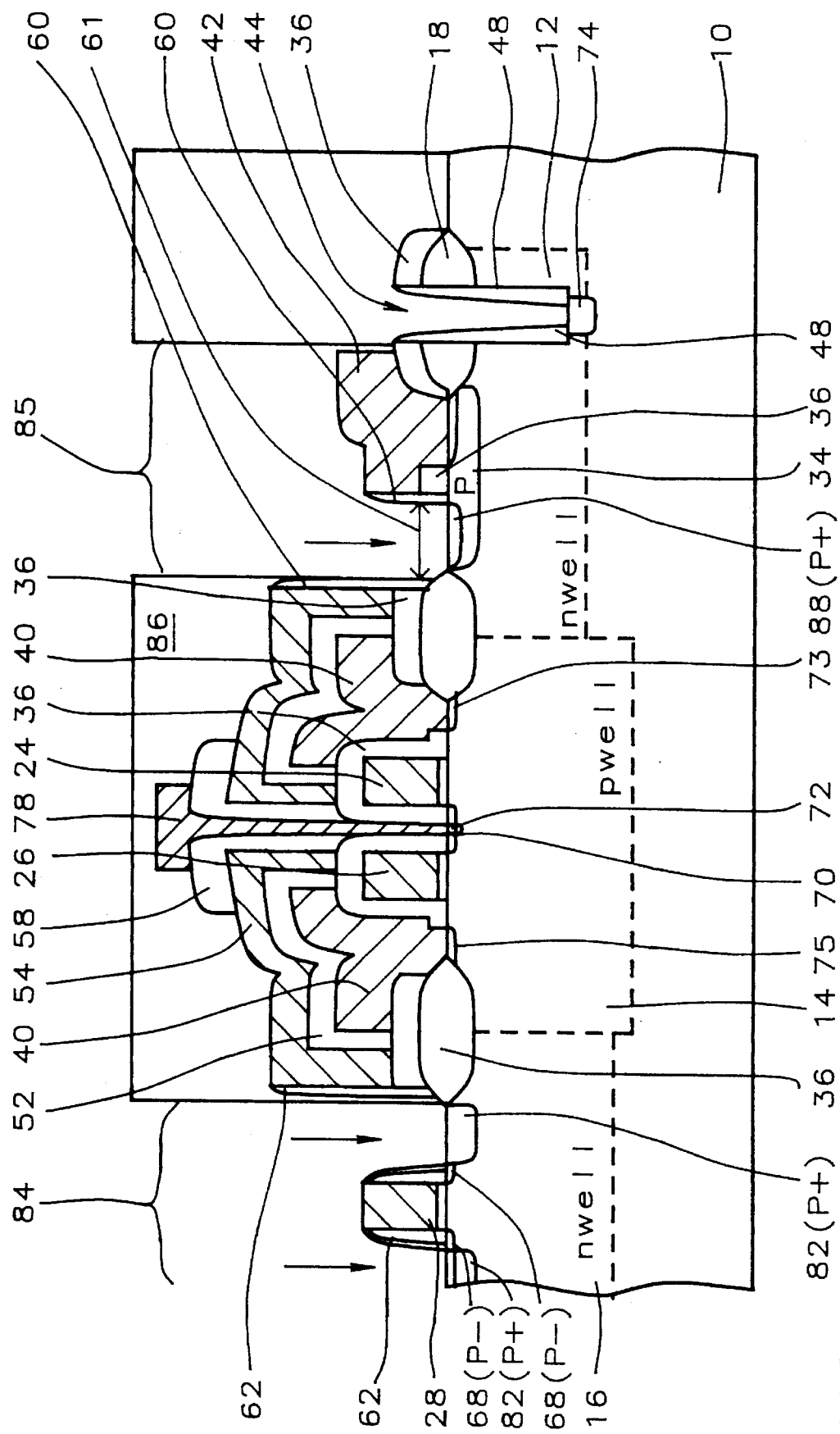

As shown in FIG. 7, a P+ base (bipolar) and P+ source/drain (CMOS) implant mask 86 is formed over the substrate surface having openings 85 over the extrinsic base regions 88 and openings 84 over the source/drain regions 82 of the CMOS transistor. P-type impurity ions are implanted through the base contact opening 61 forming an extrinsic base 88 in the base region through the base contact 61 opening forming the extrinsic base regions 88 using the gate structures 28 62 as a mask. The source/drain region 82 are ion implanted thorough the opening 84. The source/drains 82 and extrinsic base 88 are implanted preferably using a p type atomic species, for example, Boron. The implantation is usually done through a thin layer of silicon oxide of about 200 to 300 Å in thickness to minimize implant channeling and to protect against contamination by metals and other impurities. A typical implantation dose being between 1E15 to 1E16 atoms/cm$^2$ and an energy of between about 25 to 50 Kev. After the implant the resist layer 86 is removed. The source/drains 82 and the extrinsic base region 88 have a p-type impurity concentration in the range of between about 1E18 and 1E20 atoms/cm$^3$.

Figure 8:
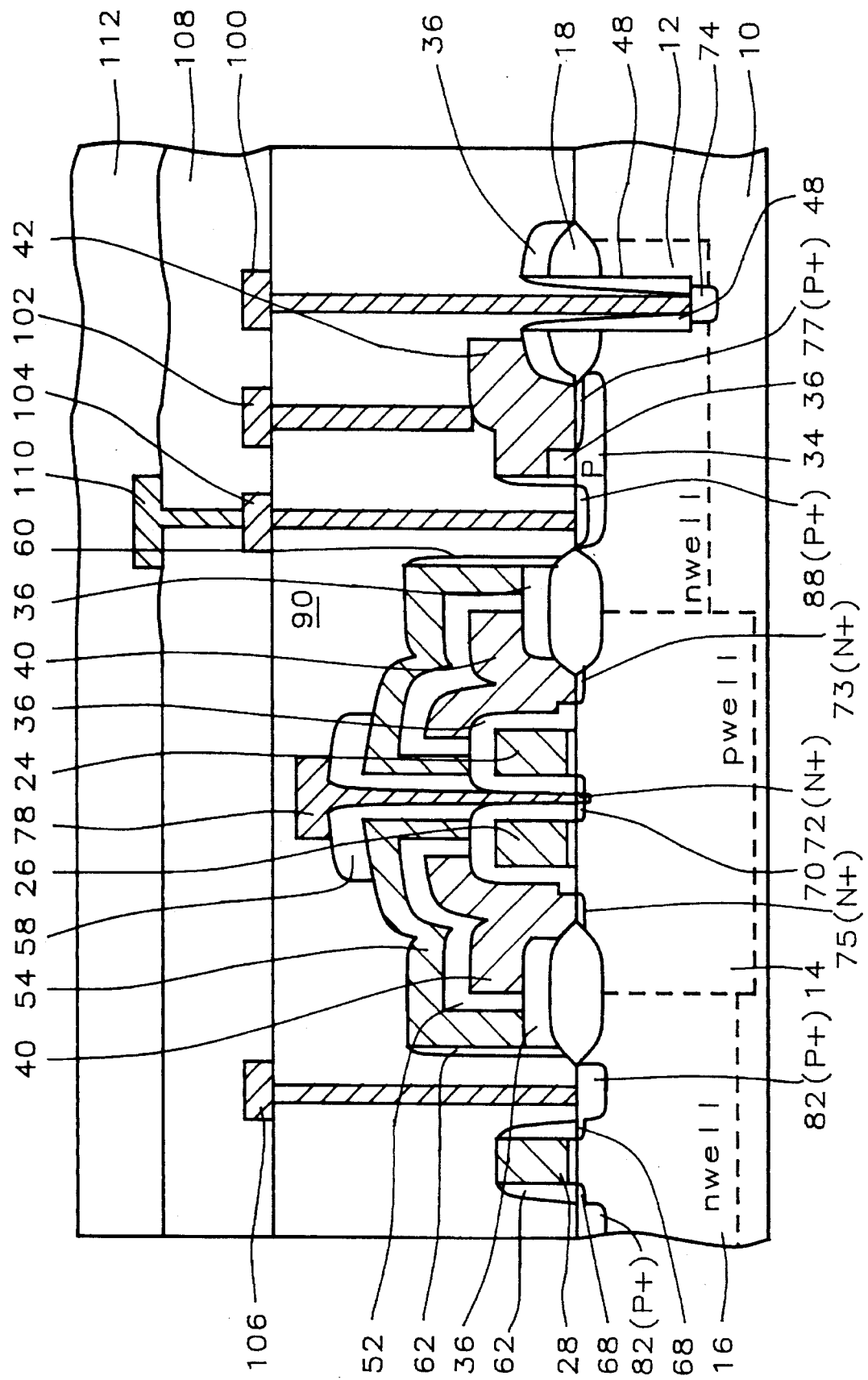

Turning to FIG. 8, a first passivation layer 90 is now formed over the substrate surface. The first passivation layer 90 is preferably formed of a material selected from the group, consisting of: undoped oxide and borophosphosilicate glass (BPSG); and preferably has a thickness in the range of between about 7000 and 15, 000 Å and more preferably about 10,000 Å. The undoped oxide is preferably formed by a conventional low pressure chemical vapor deposition (LPCVD) or a plasma enhanced chemical vapor deposition (PECVD) process.

Subsequently, contact openings are formed in the first passivation layer 50 over the source/drain regions 82, N+ collector region 74, over the extrinsic base 88, and the emitter contact plug 42. The contact openings can be formed using conventional lithographic techniques.

First metal contacts 100, 102, 104, 106 are formed in the contact openings to the source/drain regions 82, collector region 74, extrinsic base 88, and emitter contact plug 42. The first metal contacts preferably are formed from Ti, TiN W, and Al/TiN metals.

Afterwards, a second passivation layer 108 is formed over the first metal contacts 100, 102, 104, 106 and the first passivation layer 90. The second passivation layer 108 is preferably formed of undoped oxide; and preferably has a thickness in the range of between about 7000 and 15,000 Å and more preferably about 10,000 Å.

A second metal contact 110 to the first metal base contact 104 (to the extrinsic base 104) is formed preferably through the second passivation layer 108 using conventional techniques. The second metal contact 110 provides denser packing. Additional second metal contacts can be formed depending on the application. Only one is shown in FIG. 8 for illustration purposes only.

A third passivation layer 112 is then formed over the second passivation layer 108 and the second metal contact 110 thereby completing the memory cell and a vertical Bipolar transistor. The third passivation layer 112 is preferably formed of PECVD Oxi-nitride; and has a thickness in the range of between about 5000 and 10,000 Å and more preferably about 7000 Å.

Figure 9:
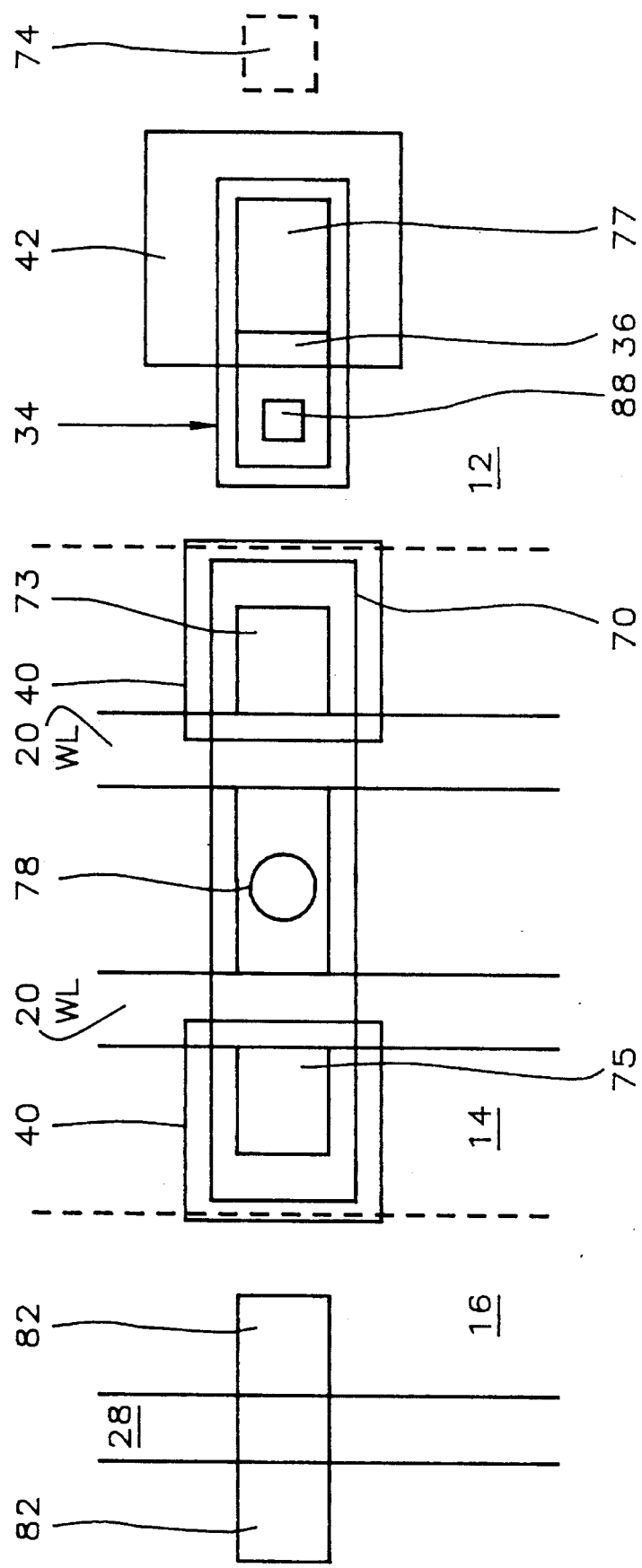
FIG. 9 is a schematic top down view of the layout of elements of the devices including a memory cell and a bipolar transistor for illustrating the method for simultaneously manufacturing a CMOS DRAM, a CMOS transistor, and a bipolar transistor according to the present invention.

FIG. 9 shows a schematic top down view of the device showing a preferred layout of various selected elements.

It is obvious to one skilled in the art that opposite conductivity type devices (e.g., switch N and P type structures) can be formed using the process of the current invention.

Figure 10:
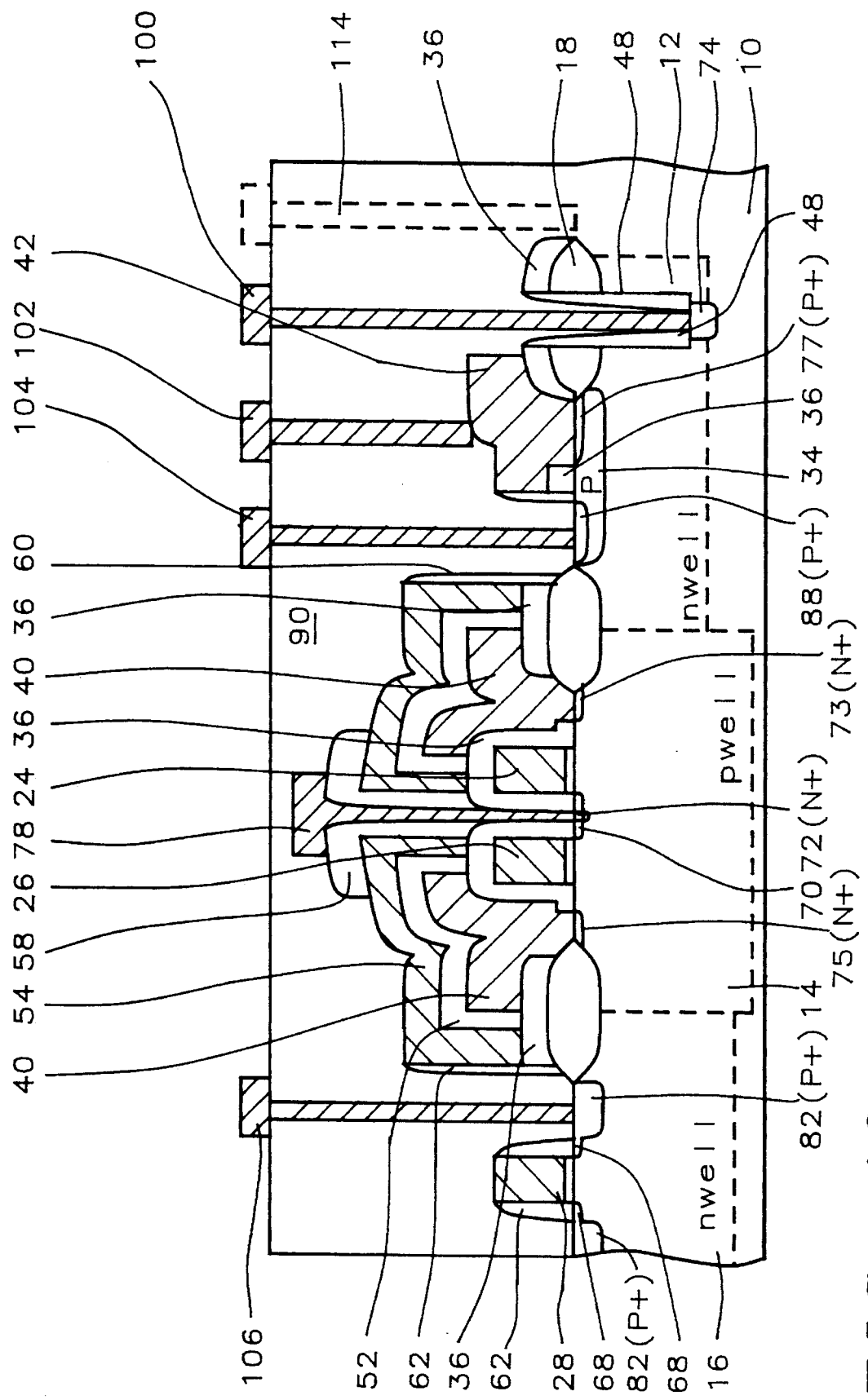
FIG. 10 is a cross sectional view views for illustrating the method for simultaneously manufacturing a CMOS DRAM cell, a CMOS transistor and a bipolar transistor according to the present invention and shows the reduction in the distance between the collector and the base which decreases the silicon resistance and the collector resistance.

The present invention provides a method of simultaneously forming CMOS DRAM cells, CMOS devices, and vertical bipolar transistors on the same chip. The method uses only one additional mask (a base implant mask) compared to forming the CMOS DRAM cell alone. Also, to reduce the collector resistance, the process uses a tungsten-plug module in the field oxide region. Unlike other bipolar processes where the extrinsic collector contact is on active silicon, this invention forms the collector contact through a field oxide area. The invention's scheme can shorten the distance between extrinsic collector and the intrinsic collector, thus further reducing collector resistance. As seen in FIG. 10, the distance R is the distance between the source of the invention and the source 114 formed on the other side of the field oxide 12. The shorter distance R between the base 34 and the collector 74 reduces the collector resistance providing better bipolar device performance.

While the invention has been particularly shown and described with reference to the preferred embodiments thereof, it will be understood by those skilled in the art that various changes in form and details may be made without departing from the spirit and scope of the invention.

What is claimed is:

1. A method of simultaneously fabricating a memory cell and a vertical bipolar transistor in a substrate having spaced field oxide regions defining a DRAM active area and a bipolar active area, two spaced gate electrodes over said DRAM active area, a well of a first type conductivity in said DRAM active area and a well of a second opposite type conductivity in said bipolar active area, comprising the sequential process steps of:

a) forming a base region in said bipolar active area;

b) forming a first dielectric layer over a substrate surface;

c) forming storage node contact openings in said first dielectric layer between said field oxide regions and said gate electrodes in said DRAM active area, and in said bipolar active area, forming an emitter opening through said first dielectric layer over portions of said base region, and a collector opening through said first dielectric layer and through a field oxide region;

d) forming a first doped polysilicon layer over said first dielectric layer;

e) patterning said first doped polysilicon layer forming storage electrodes over said storage node contact openings and an emitter contact plug in said emitter opening, and forming, during the patterning said first doped polysilicon layer, a collector trench in said DRAM active area through said collector opening, said collector trench having side walls, said storage electrodes and said emitter contact plug containing impurities;

f) forming a capacitor dielectric layer over said storage electrodes, and a collector trench spacer on said sidewalls of said collector trench;

g) depositing a top electrode over said capacitor dielectric layer, heating said substrate forming an emitter region under said emitter contact plug, and forming source regions under said storage electrodes by diffusing said impurities from said emitter contact plug and said storage electrodes;

h) forming a base contact opening through said first dielectric layer over portions of said base region and a bit line opening through said first dielectric layer between said spaced gate electrodes;

i) forming bit line spacers over at least portions of sidewalls of said top electrode over said gate electrodes and over portions of sidewalls of said gate electrodes; and forming base contact spacers on sidewalls of said emitter contact plug and said storage electrodes;

j) forming an oxide layer over the substrate surface;

k) removing said oxide layer over said bit line opening;

l) forming a second doped polysilicon layer over said substrate surface, said second doped polysilicon layer filling said bit line opening and contacting the substrate;

m) patterning said oxide layer and said second doped polysilicon layer forming a bit line contact plug in said bit line opening contacting the substrate surface, said bit line contact plug having an impurity doping which diffuses into said substrate thereby forming a bit line;

n) implanting ions through said collector trench forming a collector region at a bottom of said collector trench; and o) implanting ions through said base contact opening forming an extrinsic base in said base region.

2. The method of claim 1 which further includes:

p) forming a first passivation layer over the substrate surface;

q) forming contact openings in said first passivation layer over said collector region, over said extrinsic base, and over said emitter contact plug;

r) forming first metal contacts to said collector region, extrinsic base, and emitter contact plug in said contact openings in said first passivation layer;

s) forming a second passivation layer and a second metal contact to the first metal base contact to said extrinsic base; and t) forming a third passivation layer over said second passivation layer and said second metal contact thereby completing said memory cell and said vertical bipolar transistor.

3. The method of claim 1 which further includes after step (i), implanting ions through said bit line opening using at an angle forming a lightly doped bit line in said substrate.

4. The method of claim 1 which further includes forming a second well having a second type conductivity in said DRAM active area and forming CMOS transistors in said second well.

5. The method of claim 1 wherein before step (a) implanting impurity ions having a p-type conductivity into the substrate forming a threshold voltage implant layer said threshold voltage implant layer having an impurity concentration in a range of between about 1E12 and 1E13 atoms/$cm^3$ and a maximum depth in a range of between about 0.05 and 0.15 µm.

6. The method of claim 1 wherein in said step (a) said base region is formed by implanting p-type impurity ions with an energy in a range of between about 5 and 25 Kev, with a dose in a range of between about 1E13 and 1E14 atoms/$cm^2$, and said impurity ions are Boron, and said base region has an impurity concentration in a range of between about 1E17 and 1E18 atoms/cm$^3$.

7. The method of claim 1 wherein said collector trench has a depth in a range of between about 0.4 and 0.8 μm and an area in a range of between about 0.25 and 0.5 μm$^2$.

8. The method of claim 1 wherein said extrinsic base has a doping concentration in a range of between about 1E18 and 1E20 atoms/cm$^3$.

9. The method of claim 1 wherein said base region has a dopant concentration in a range of between about 1E17 and 1E20 atoms/cm$^3$.

10. The method of claim 1 wherein said first type conductivity is p-type and said second type conductivity is N-type.

11. The method of claim 1 wherein said first dielectric layer has a thickness in a range of between about 1000 and 3000 Å and is formed of silicon oxide.

12. The method of claim 1 wherein said first doped polysilicon layer has a thickness in the in a range of between about 2000 and 6000 Å and an impurity doping in a range of between about 1E20 and 1E21 atoms/cm$^3$.

13. A method of simultaneously fabricating a memory cell and a vertical bipolar transistor, in a substrate having spaced field oxide regions defining a DRAM active area and a bipolar active area, two spaced gate electrodes over said DRAM active area, a well of a first type conductivity in said DRAM active area and a well of a second opposite type conductivity in said bipolar active area, comprising the sequential process steps of:

a) forming a base region in said bipolar active area;

b) forming a first dielectric layer over a substrate surface;

c) forming storage node contact openings in said first dielectric layer between said field oxide regions and said gate electrodes in said DRAM active area, and in said bipolar active area, forming an emitter opening through said first dielectric layer over portions of said base region, and a collector opening through said first dielectric layer and through a field oxide region;

d) forming a first doped polysilicon layer over said first dielectric layer;

e) patterning said first doped polysilicon layer forming storage electrodes over said storage node contact openings and an emitter contact plug in said emitter opening, and forming, during the pattering said first doped polysilicon layer, a collector trench in said DRAM active area through said collector opening, said collector trench having side walls, said storage electrodes and said emitter contact plug containing impurities;

f) forming a capacitor dielectric layer over said storage electrodes, and a collector trench spacer on said sidewalls of said collector trench;

g) depositing a top electrode over said capacitor dielectric layer, heating said substrate forming an emitter region under said emitter contact plug, and forming source regions under said storage electrodes by diffusing said impurities from said emitter contact plug and said storage electrodes;

h) forming a base contact opening through said first dielectric layer over portions of said base region and a bit line opening through said first dielectric layer between said spaced gate electrodes;

i) implanting ions through said bit line opening forming a lightly doped bit line in said substrate;

j) forming bit line spacers over at least portions of sidewalls of said top electrode over said gate electrodes and over portions of sidewalls of said gate electrodes; and forming base contact spacers on sidewalls of said emitter contact plug and said storage electrodes;

k) forming an oxide layer over the substrate surface;

l) removing said oxide layer over said bit line opening;

m) forming a second doped polysilicon layer over said substrate surface, said second doped polysilicon layer filling said bit line opening and contacting the substrate;

n) patterning said oxide layer and said second doped polysilicon layer forming a bit line contact plug in said bit line opening contacting the substrate surface, said bit line contact plug having an impurity, doping which diffuses into said substrate thereby forming a bit line;

o) implanting ions through said collector trench forming a collector region at a bottom of said collector trench;

p) implanting ions through said base contact opening forming an extrinsic base in said base region;

q) forming a first passivation layer over the substrate surface;

r) forming contact openings in said first passivation layer over said collector region, over said extrinsic base, and over said emitter contact plug;

s) forming first metal contacts to said collector region, extrinsic base, and emitter contact plug in said contact openings in said first passivation layer;

t) forming a second passivation layer and a second metal contact to the first metal base contact to said extrinsic base; and u) forming a third passivation layer over said second passivation layer and said second metal contact thereby completing said memory cell and said vertical bipolar transistor.

14. The method of claim 13 wherein said first type conductivity is p-type and said second type conductivity is N-type.

15. The method of claim 13 wherein before step (a) implanting impurity ions having a p-type conductivity into the substrate forming a threshold voltage implant layer, said threshold voltage implant layer having an impurity concentration in a range of between about 1E12 and 1E13 atoms/cm$^3$ and a maximum depth in a range of between about 0.05 and 0.15 μm.

16. The method of claim 13 wherein said spaced gate electrodes comprise a gate oxide layer, a polysilicon gate, and the spacing between said spaced gate electrodes in a range of between about 0.3 and 1.0 μm.

17. The method of claim 13 wherein in said step (a) said base region is formed by implanting p-type impurity ions with an energy in a range of between about 5 and 25 Kev, with a dose in a range of between about 1E13 and 1E14 atoms/cm$^2$, and said impurity ions are boron, and said base region has an impurity concentration in a range of between about 1E17 and 1E18 atoms/cm$^3$.

18. The method of claim 13 wherein said first dielectric layer has a thickness in a range of between about 1000 and 3000 Å and is formed of silicon oxide.

19. The method of claim 13 wherein said first doped polysilicon layer has a thickness in a range of between about 2000 and 6000 Å and an impurity doping in a range of between about 1E20 and 1E21 atoms/cm$^3$.

20. The method of claim 13 wherein said collector trench has a depth in a range of between about 0.4 and 0.8 μm and an area in range of between about 0.25 and 0.5 μm$^2$.

21. The method of claim 13 wherein said collector trench spacer is formed of a material selected from the group consisting of ONO, silicon oxide, and silicon nitride, and has a thickness in a range of between about 50 and 90 Å.

22. The method of claim 13 wherein said extrinsic base has a doping concentration in a range of between about 1E18 and 1E20 atoms/cm$^3$.

23. The method of claim 13 wherein said base region has a doping concentration in a range of between about 1E17 and 1E20 atoms/cm$^3$.

24. The method of claim 13 wherein said lightly doped bit line has a concentration in a range of between about 1E17 and 1E18 atoms/cm$^3$.

25. The method of claim 13 wherein in step (i) said ion implant is performed at an angle from vertical in a range of between about 30° and 60° and a dose in a range of between about 1E13 and 1E14 atoms/sq-cm and an energy in a range of between about 60 and 120 keV.

26. The method of claim 13 wherein said first passivation layer is formed of a material selected from the group consisting of undoped oxide and borophosphosilicate glass and has a thickness in a range of between about 7000 and 15,000 Å.

27. The method of claim 13 wherein said capacitor dielectric layer is formed of a material selected frown the group consisting of ONO, silicon nitride and silicon oxide and has a thickness in a range of between about 50 and 90 Å.

28. The method of claim 13 wherein said top electrode has a thickness in a range between about 2000 to 4000 Å and a dopant concentration in a range of between about 1E20 and 1E21 atoms/cm$^3$.

29. The method of claim 13 wherein said collector region has a concentration in a range of between about 1E18 and 1E20 atoms/cm$^3$.

30. The method of claim 13 which further comprises simultaneously forming CMOS transistors with said memory cell and a vertical bipolar transistor in the DRAM active area in a well having a second type conductivity.

* * * * *